(12) United States Patent
Eliashevich et al.

(10) Patent No.: US 7,285,801 B2
(45) Date of Patent: Oct. 23, 2007

(54) LED WITH SERIES-CONNECTED MONOLITHICALLY INTEGRATED MESAS

(75) Inventors: Ivan Eliashevich, Maplewood, NJ (US); Chris Bohler, North Royalton, OH (US); Bryan S. Shelton, Bound Brook, NJ (US); Hari S. Venugopalan, Somerset, NJ (US); Xiang Gao, Edison, NJ (US)

(73) Assignee: Lumination, LLC, Valley View, OH (US)

( * ) Notice: Subject to any disclaimer, the term of this patent is extended or adjusted under 35 U.S.C. 154(b) by 352 days.

(21) Appl. No.: 10/817,603

(22) Filed: Apr. 2, 2004

(65) Prior Publication Data

US 2005/0225973 A1    Oct. 13, 2005

(51) Int. Cl.
*H01L 33/00* (2006.01)

(52) U.S. Cl. .............................. 257/96; 257/94; 257/95; 257/88; 257/103; 257/99

(58) Field of Classification Search ...................... None
See application file for complete search history.

(56) References Cited

U.S. PATENT DOCUMENTS

| | | | |
|---|---|---|---|
| 5,821,617 A | 10/1998 | Autry et al. | |
| 5,940,683 A | 8/1999 | Holm et al. | |
| 6,187,611 B1 | 2/2001 | Preston et al. | |
| 6,307,218 B1 | 10/2001 | Steigerwald et al. | |
| 6,320,206 B1 | 11/2001 | Coman et al. | |
| 6,417,019 B1 | 7/2002 | Mueller et al. | |
| 6,420,199 B1 | 7/2002 | Coman et al. | |
| 6,455,878 B1 | 9/2002 | Bhat et al. | |
| 6,514,782 B1 | 2/2003 | Wierer, Jr. et al. | |
| 6,547,249 B2 * | 4/2003 | Collins et al. | 257/88 |
| 6,573,537 B1 | 6/2003 | Steigerwald et al. | |
| 6,966,674 B2 * | 11/2005 | Tsai | 362/294 |

\* cited by examiner

*Primary Examiner*—Evan Pert
*Assistant Examiner*—Fazli Erdem
(74) *Attorney, Agent, or Firm*—Fay Sharpe LLP

(57) ABSTRACT

A light emitting semiconductor device die (10, 110, 210, 310) includes an electrically insulating substrate (12, 112). First and second spatially separated electrodes (60, 62, 260, 262, 360, 362) are disposed on the electrically insulating substrate. The first and second electrodes define an electrical current flow direction directed from the first electrode to the second electrode. A plurality of light emitting diode mesas (30, 130, 130', 230, 330) are disposed on the substrate between the first and second spatially separated electrodes. Electrical series interconnections (50, 150, 250, 350) are disposed on the substrate between neighboring light emitting diode mesas. Each series interconnection carries electrical current flow between the neighboring mesas in the electrical current flow direction.

23 Claims, 6 Drawing Sheets

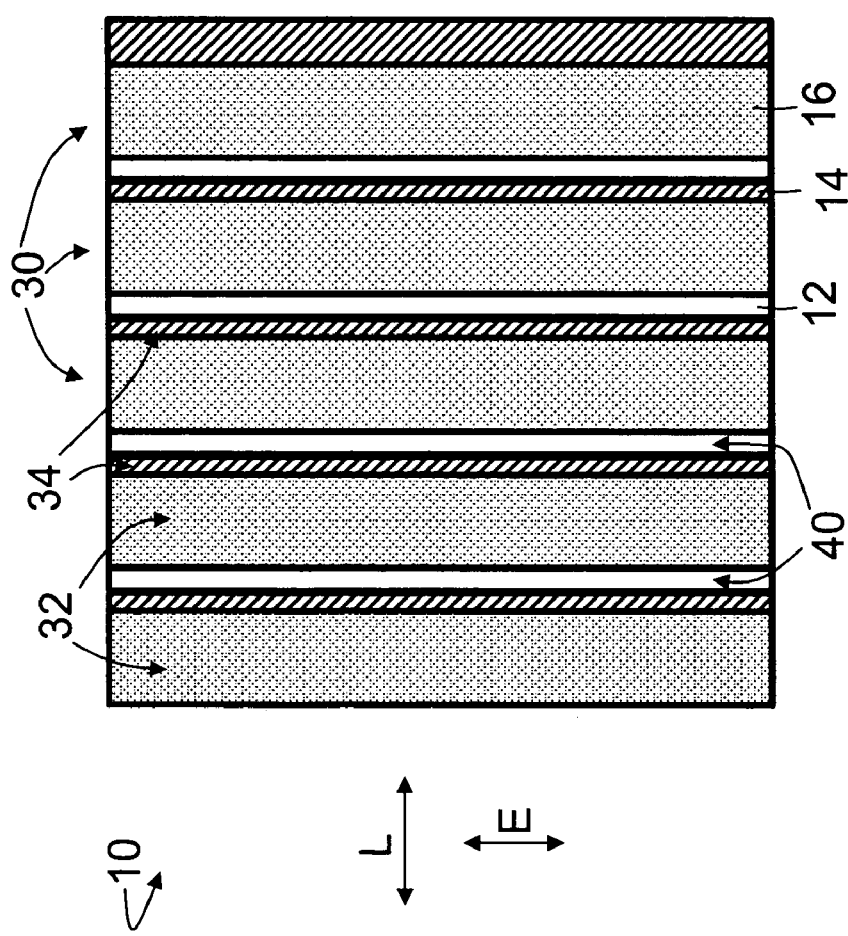
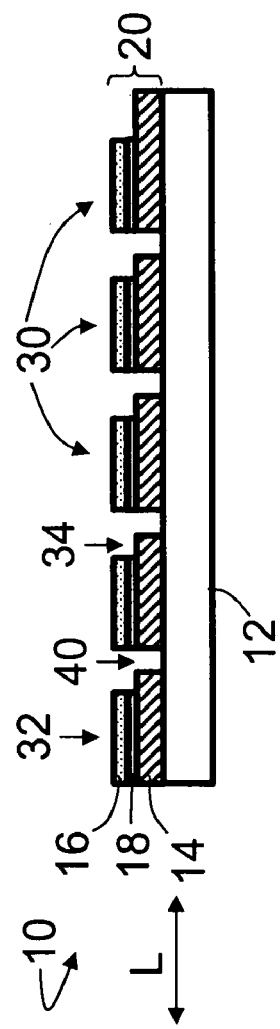

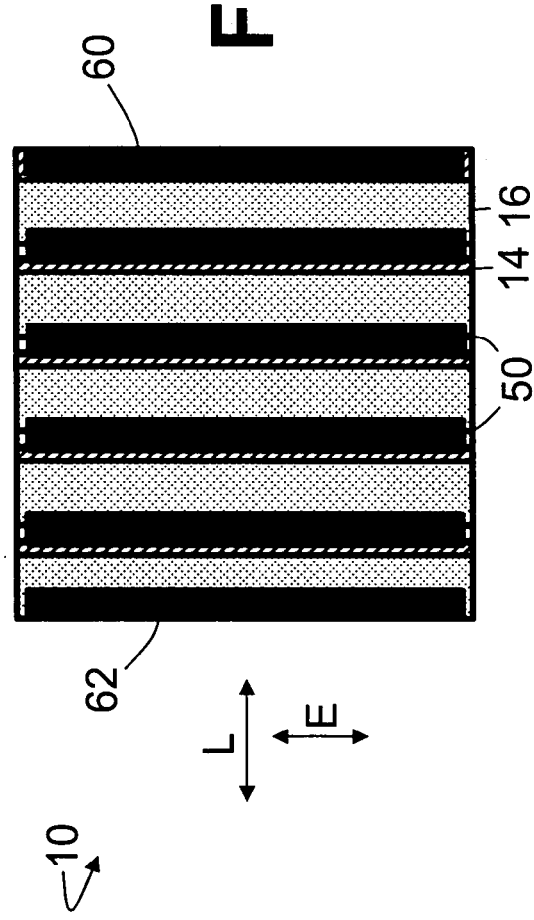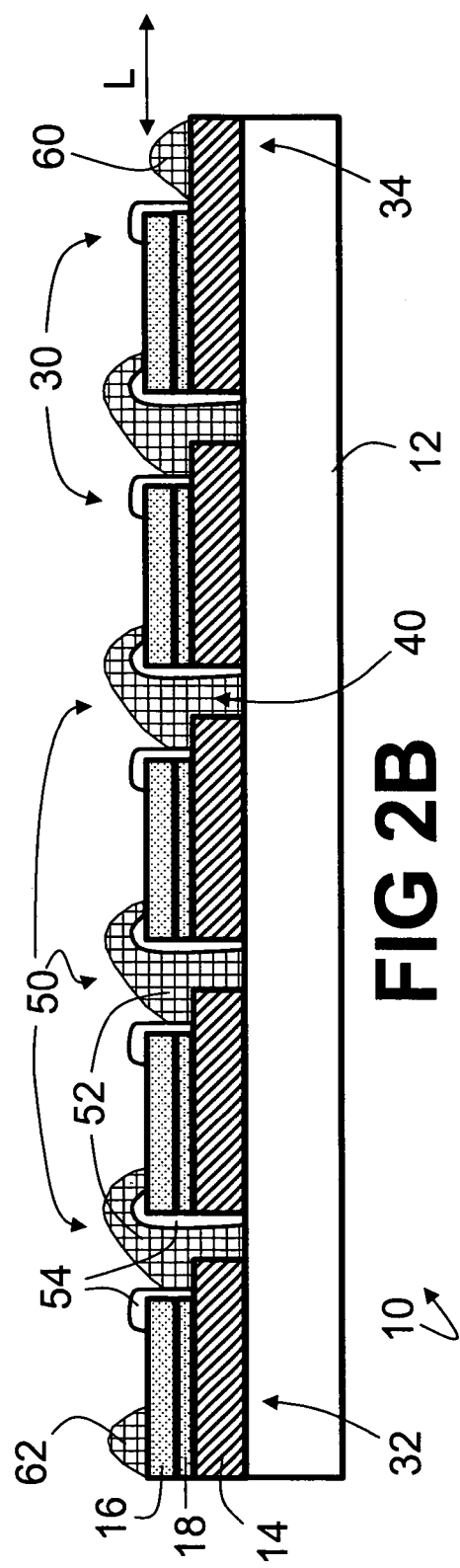

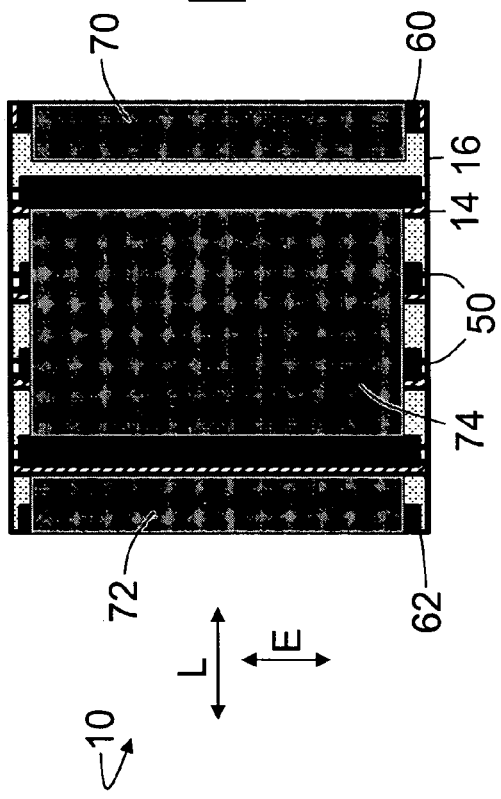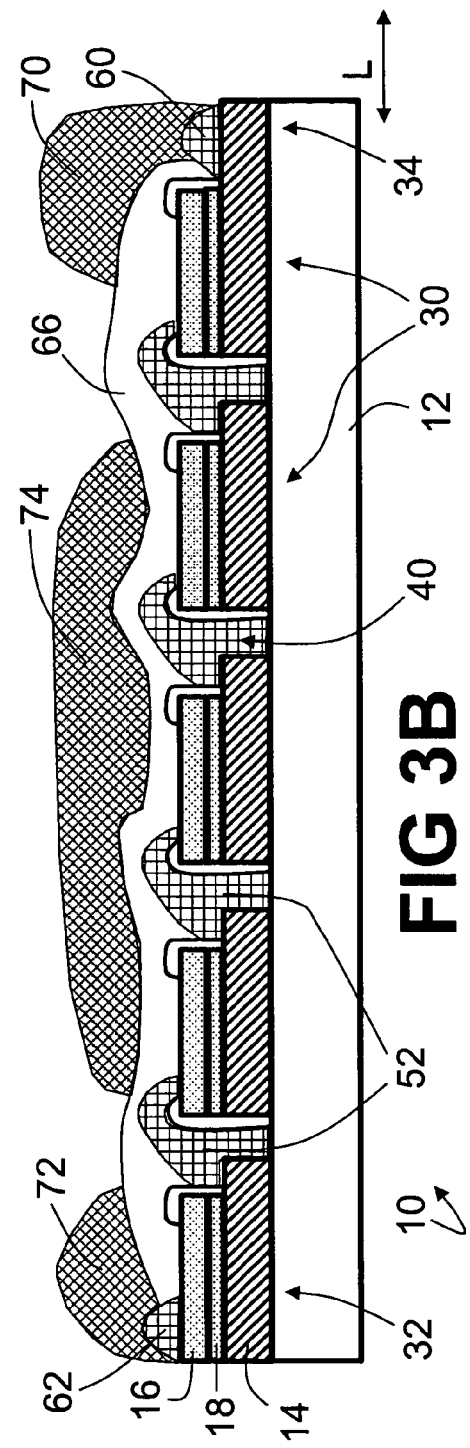

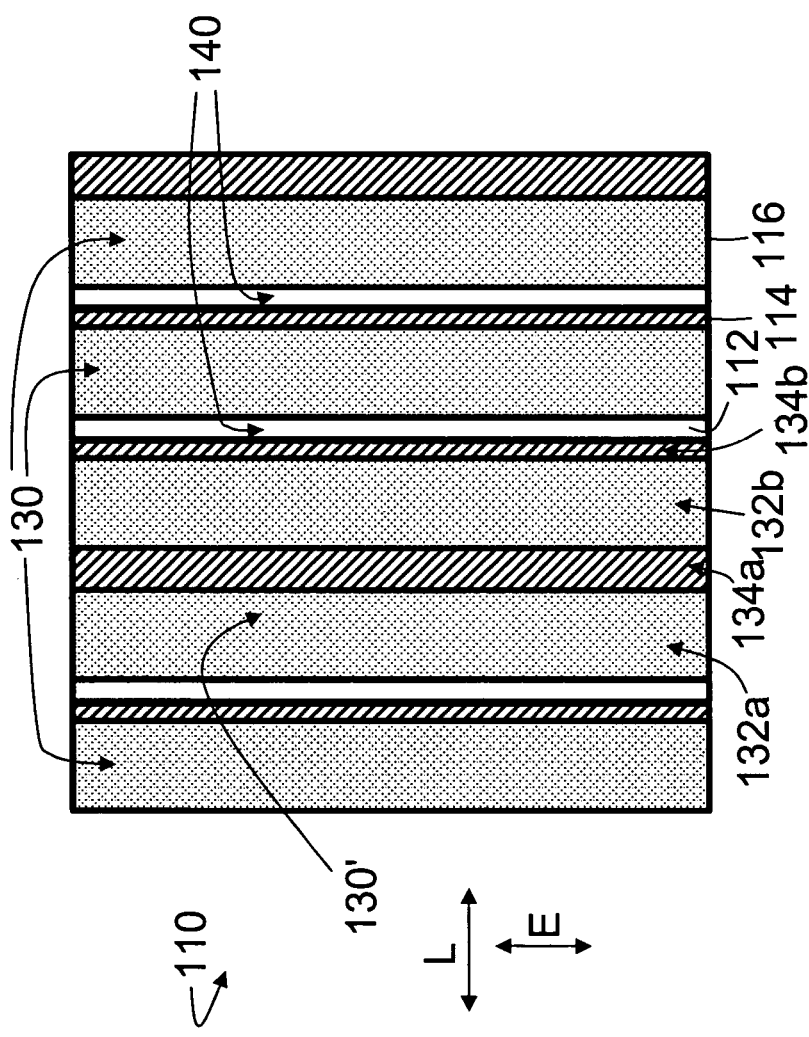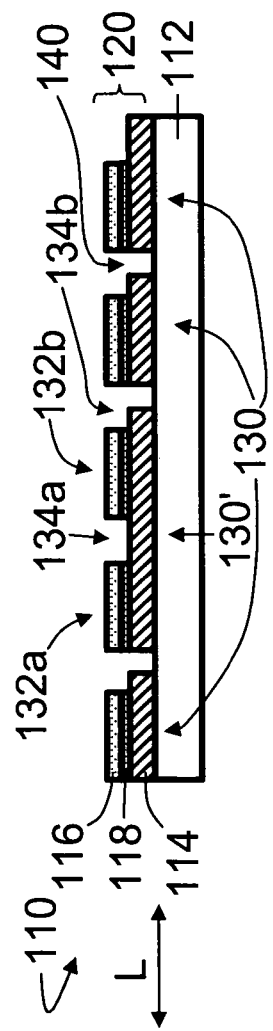

LED WITH SERIES-CONNECTED MONOLITHICALLY INTEGRATED MESAS

BACKGROUND

The present invention relates to the lighting arts. It especially relates to light emitting diodes with inverted flip-chip orientations, and will be described with particular reference thereto. However, the invention will also find application in conjunction with non-inverted light emitting diodes, laser diodes, and the like.

Light emitting diodes are generally low voltage devices having operating voltages of a few volts. For example, a typical gallium nitride-based light emitting diode has a forward operating voltage of about 3-4 volts. Low voltage devices have certain disadvantages at the system level. Voltage dividers, power regulators, or other power conditioning circuitry may be needed to reduce high voltage electrical power to a level suitable for driving the light emitting diodes. Moreover, the low voltage calls for relatively high operating current to achieve high brightness. Since resistive power losses scale with current-squared, increasing current can reduce light conversion efficiency. Moreover, since interconnect voltage drops per unit length of wire or printed circuit trace increases proportionally with current, high operating currents can limit the spatial separation between the power source and the light emitting diode.

At the die level, low voltage operation is also problematic. The forward operating voltage is determined largely by the bandgap of the semiconductor material, which is substantially constant for a given material. Additional resistive voltage drops due to resistance of the semiconductor layers (and of the substrate if it is part of the current path) also contribute to the forward voltage. However, resistive voltage drops generally do not substantially increase light output intensity, since some of the energy is going into resistive heating. Furthermore, the resistive heating can increase the resistivity of the semiconductor materials, further exasperating the resistance problem. Resistive heating can produce other undesirable effects such as thermal device failure. In summary, the low voltage, high current nature of light emitting diodes limits the magnitude of light output that can be achieved with a single diode junction.

One approach for overcoming these low voltage issues is to series-interconnect a plurality of light emitting diodes. Series interconnection can be done at the system level by connecting a plurality of discrete light emitting diode components in series. However, such component-level series interconnection increases system complexity and produces a spatially distributed light source. Additionally, failure of one device in the series breaks the current path and can cause failure of the entire series-interconnected chain of light emitting diodes.

It is also known to series-interconnect a plurality of light emitting diode mesas on a single substrate to provide a light emitting diode die with monolithically integrated series-interconnected light emitting diode mesas. Such light emitting diode devices are described, for example, in Steigerwald et al., U.S. Pat. No. 6,307,218, and in Collins, III et al., U.S. Pat. No. 6,547,249.

However, these light emitting diode devices have certain disadvantages. The devices typically exhibit non-uniform current distribution because current is injected from the mesa side and spreads non-uniformly over the mesa area. Such current non-uniformity can reduce light output efficiency and can introduce thermal hotspots. Moreover, the entire device die may degrade in performance or catastrophically fail due to a current flow problem with any single mesa, or with any single series interconnection in the series-interconnected chain of light emitting diode mesas. A relatively long overall current path of the device also leads to increased resistive voltage drop, increased resistive current-squared power losses, and consequent reduction in light output efficiency. Still further, the electrodes of the die are relatively large to accommodate the power input needed to drive the plurality of mesas in series, and these large electrodes are disposed outside the light emitting area, which substantially reduces the active area of the light emitting diode die.

The present invention contemplates an improved apparatus and method that overcomes the above-mentioned limitations and others.

BRIEF SUMMARY

According to one aspect, a light emitting device is disclosed, including an electrically insulating substrate. A plurality of elongated light emitting diode mesas are disposed generally parallel to one another on the substrate. The mesas are electrically isolated from one another. Each mesa is defined by a stack of layers including a first conductivity type layer disposed between the substrate and a second conductivity type layer. Electrically conductive connection material is disposed on the substrate between neighboring elongated light emitting diode mesas. The conductive material electrically connects the first conductivity type layer of one mesa with the second conductivity type layer of the neighboring mesa along the long dimension of the neighboring elongated mesas to series interconnect the light emitting diode mesas.

According to another aspect, a light emitting semiconductor device die is disclosed. A plurality of series interconnected light emitting diode mesas are disposed on an electrically insulating substrate. N-type and p-type electrodes electrically connect with the plurality of series interconnected light emitting diode mesas. An insulating layer is disposed over at least a portion of the plurality of series interconnected light emitting diode mesas. Electrical bonding pads are disposed on the insulating layer. The electrical bonding pads electrically connect with the n-type and p-type electrodes through gaps in the insulating layer. The electrical bonding pads have a larger area than the corresponding n type and p type electrodes.

According to yet another aspect, a light emitting semiconductor device die is disclosed. A linear arrangement of light emitting diode mesas are disposed on an electrically insulating substrate. Electrical series interconnections are disposed on the substrate between neighboring light emitting diode mesas of the linear arrangement. The series interconnections interconnect the light emitting diode mesas in series to form a series interconnected linear arrangement of light emitting diode mesas. First and second electrodes electrically connect at opposite ends with the series interconnected linear arrangement of light emitting diode mesas. The linear arrangement of light emitting diode mesas extend in the linear direction between the first and second electrodes.

According to still yet another aspect, a light emitting semiconductor device die includes an electrically insulating substrate. First and second spatially separated electrodes are disposed on the electrically insulating substrate. The first and second electrodes define an electrical current flow direction directed from the first electrode to the second electrode. A plurality of light emitting diode mesas are disposed on the substrate between the first and second spatially separated electrodes. Electrical series interconnections are disposed on the substrate between neighboring light emitting diode mesas. Each series interconnection carries electrical current flow between the neighboring mesas in the electrical current flow direction.

One advantage resides in improved uniformity of current distribution in the light emitting diode die.

Another advantage resides in substantial reduction in hotspots due to reduced current bunching.

Another advantage resides in providing substantially unidirectional current flow for a series-interconnected set of light emitting diode mesas on a device die. The unidirectional current flow provides a short total current path length for a series-interconnected set of light emitting diode mesas on a device die, which in turn reduces resistive power losses and increases device robustness.

Another advantage resides in improved robustness against localized defects due to a wide or elongated current distribution transverse to the current flow direction.

Still yet another advantage resides in providing elongated spaced-apart electrodes that do not occupy a substantial amount of die real estate.

Numerous additional advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. The drawings of light emitting diode die are not drawn to scale.

FIGS. 1A and 1B show top and side views, respectively, of a light emitting diode die including five light emitting diode mesas suitable for series interconnection. The series interconnect structure is omitted in FIGS. 1A and 1B.

FIGS. 2A and 2B show top and side views, respectively, of the light emitting diode die of FIGS. 1A and 1B including the electrical series-interconnect structure.

FIGS. 3A and 3B show top and side views, respectively, of the light emitting diode die of FIG. 2 with bonding pads for facilitating flip-chip bonding or wire bonding.

FIGS. 4A and 4B show top and side views, respectively, of a light emitting diode die including four light emitting diode mesas suitable for series interconnection, in which one mesa is divided in the linear direction into two strip sub-mesas suitable for parallel interconnection. The series and parallel interconnect structure is omitted in FIGS. 4A and 4B.

DETAILED DESCRIPTION OF PREFERRED EMBODIMENTS

Figure 5:
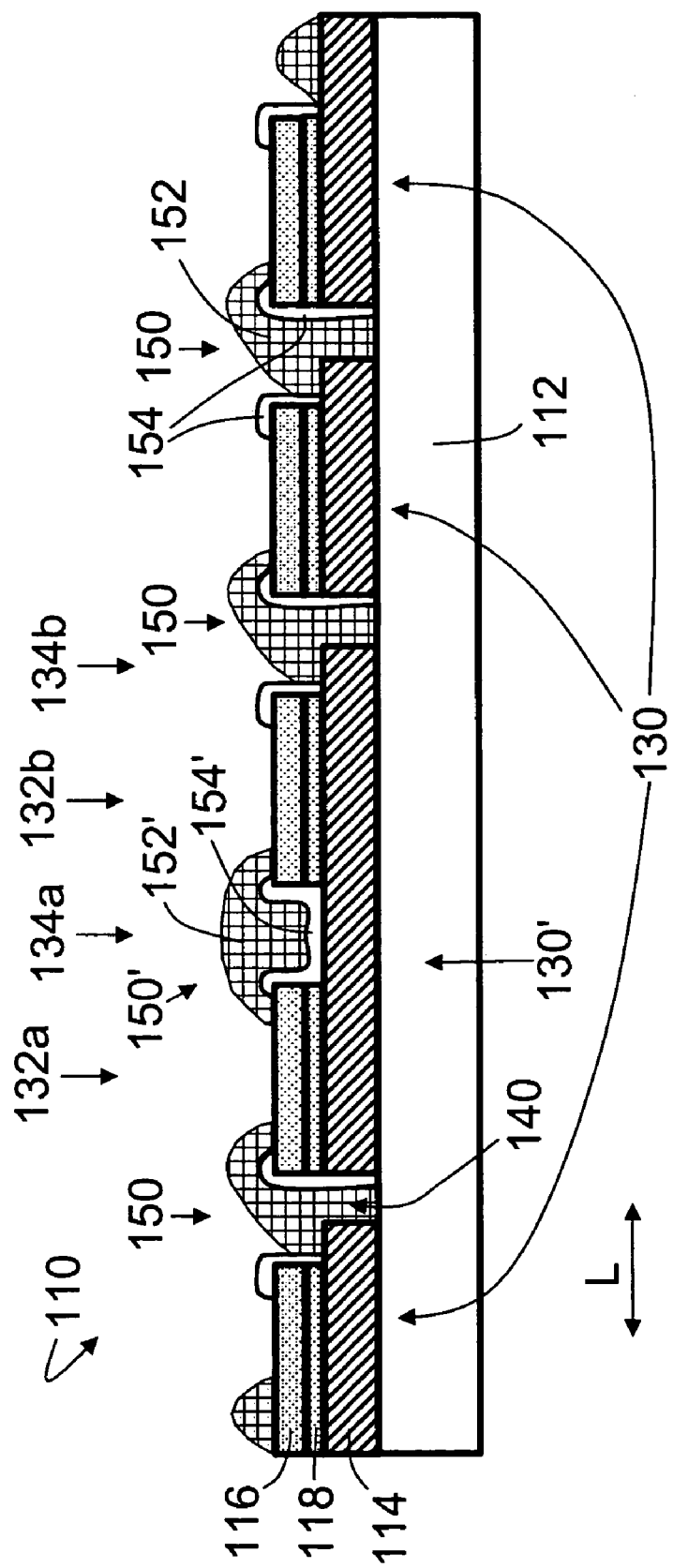
FIG. 5 shows a side view of the light emitting diode die of FIGS. 4A and 4B including the electrical series-interconnect structure.

With reference to FIGS. 1A and 1B, a light emitting diode die 10 includes a substrate 12, a first conductivity type layer 14 disposed between the substrate 12 and a second conductivity type layer 16, and an active region 18 disposed between the first and second conductivity type layers 14, 16. The first and second conductivity type layers 14, 16 and the active region 18 are collectively referred to herein as a device layers stack 20. In one embodiment, the substrate 12 is a sapphire, silicon carbide, or gallium nitride substrate, and the device layers stack 20 is principally made up of group III-nitride layers such as gallium nitride layers, aluminum nitride layers, indium nitride layers, and ternary and quaternary compounds thereof. In another embodiment, the substrate 12 is gallium arsenide or indium phosphide, and the device layers stack 20 is principally made up of group III-arsenide and/or group III-phosphide layers. Other semiconductor materials can also be used for the substrate 12 and device layers stack 20. Besides semiconductor materials, it is also contemplated to use other materials such as metals, insulators, or organic light emitting diode materials in forming the device layers stack 20.

The substrate 12 is substantially electrically insulating. This can be achieved by making the substrate 12 of an electrically insulating material such as sapphire. Alternatively, the substrate 12 can be made of an electrically conductive material with an insulating layer coating the electrically conductive material to provide electrical isolation. In this embodiment, it is contemplated to include the insulating layer that provides electrical isolation as one or more layers of the device layers stack 20.

In one manufacturing approach, an epitaxial crystal growth method such as molecular beam epitaxy (MBE), vapor phase epitaxy (VPE), metalorganic chemical vapor deposition (MOCVD, also known by similar names such as organometallic vapor phase epitaxy (OMVPE) or the like), is used to deposit the device layers stack 20 on the substrate 12. The first and second conductivity layers 14, 16 are typically n-type and p-type layers, respectively, or p-type and n-type layers, respectively, to form an electrical junction. The doping type can be controlled during epitaxy by controlling flow of flux of a suitable dopant source during growth of the doped layer. In another contemplated embodiment, the layer 16 is a metal layer and the layer 14 is a semiconducting layer, thus defining a Schottky light emitting diode structure.

Each of the first and second conductivity type layers 14, 16 and the active region 18 optionally can include a single layer of material, or a plurality of layers of material. For example, the first conductivity type layer 14 may include an aluminum gallium nitride layer and a gallium nitride layer. In some embodiments, the active region 18 may include multiple quantum wells, quantum dots, a superlattice, or the like. Moreover, additional layers (not shown) can be included in the device layers stack 20, such as a contact layer disposed on top of the second conductivity type layer 16 for facilitating electrical connection therewith, or a buffer layer disposed between substrate 12 and the first conductivity type layer 14 that improves epitaxial growth of the overlying epitaxial layers, or an electrical isolation layer disposed between the substrate 12 and the first conductivity type layer 14, or so forth.

With continuing reference to FIGS. 1A and 1B, the device layers stack 20 is patterned to define a plurality of elongated mesas 30, specifically five mesas 30 in FIGS. 1A and 1B, although other numbers of mesas can be included. Each mesas 30 is elongated in an elongation direction E, and the five mesas 30 are distributed along a linear direction L. Each mesa 30 includes an active area 32 containing the first and second conductivity type layers 14, 16 and the active region 18, and a first conductivity type connecting area 34 containing the first conductivity type layer 14 but not the second conductivity type layer 16 or the active region 18.

The elongated mesas 30 are separated by trenches 40 in which the device layers stack 20 has been removed. The trenches 40 provide electrical isolation of the elongated light emitting diode mesas 30 from one another. Instead of the trenches 40, other structures that provide electrical isolation can be employed, such as ion implanted insulating regions. Moreover, if the device layers stack 20 includes an electrically insulating buffer layer disposed between the substrate 12 and the first conductivity layer 14, then the electrically insulating buffer layer may be disposed in the trench regions. The trenches are suitably formed using lithographically controlled wet or dry chemical etching of selected layers of the device layers stack 30 after deposition of the device layers stack 30. In another approach, selective area epitaxy or another laterally controlled growth technique is used to deposit the device layers stack 20 only in the regions of the mesas 30, so that the trenches 40 are defined as areas where the device layers stack 20 is not deposited.

With continuing reference to FIGS. 1A and 1B, it is seen that the elongated light emitting diode mesas 30 electrically isolated by the trenches 40 define a linear arrangement of mesas 30 distributed along the linear direction L indicated in FIGS. 1A and 1B. The elongated mesas 30 are elongated in the elongation direction E that is generally transverse to the linear direction L, and the elongated mesas 30 are generally parallel with one another.

With reference to FIGS. 2A and 2B, series interconnects 50 are formed between neighboring mesas 30. Each series interconnect 50 is interposed between two neighboring elongated light emitting diode mesas 30. Thus, for the illustrated five mesas 30 there are four series interconnects 50. Each series interconnect 50 includes an electrically conductive connection material 52, such as a metal or a polysilicon conducting material, deposited in the trench 40. The electrically conductive connection material 52 electrically connects the first conductivity type connecting area 34 of one mesa 30 with the second conductivity type layer 16 of a neighboring mesa 30. While a single electrically conductive connection material 52 is illustrated, the electrically conductive connection material 52 optionally includes a plurality of components. For example, a multiple-layer metal stack can be employed, such as a nickel/gold stack, a titanium/nickel/gold stack, a platinum/nickel/silver stack, or the like, can be used to optimize portions of the electrically conductive connection material 52 for adhesive, chemical interdiffusion blocking, soldering, thermosonic bonding, or other characteristics. An insulating material 54 is deposited at least over steps defined at the intersections of the active areas 32 and the first conductivity type connecting areas 34, and at the edges of the mesas 30, to provide electrical isolation ensuring that the electrically conductive connection material 52 does not short the light emitting diode mesas 30 or electrically connect neighboring mesas 30 in parallel.

In one manufacturing process, the series interconnects 50 are suitably formed as follows. A lithographic mask is formed that exposes the areas in which the insulating material 54 is to be deposited, and the insulating material 54 is then deposited by plasma deposition or another suitable deposition technique. Alternatively, a blanket layer of insulating material can be deposited, followed by lithographically controlled etching removal of the insulating material except in the areas where the insulating material 54 is to be left. Another lithographic masking process defines the areas in which the electrically conductive connection material 52 is to be deposited, followed by deposition of the electrically conductive connection material 52. The lithography limits the deposition to the areas of the electrically conductive connection material 52 by preventing deposition in other areas, or by providing lift-off of the electrically conductive material from those other areas (e.g., a metal liftoff technique). Alternatively, a blanket layer of electrically conductive connection material can be deposited, followed by lithographically masked etching. The described methods are examples only; those skilled in the art can readily develop other microelectronics processing procedures suitable for fabricating the series interconnects 50.

Each series interconnect 50 is elongated in the same elongation direction E as the elongated neighboring light emitting diode mesas 30. Each series interconnect 50 is substantially coextensive in the elongation direction E with the length of the mesas 30 in the elongation direction E, and preferably forms electrical connection with the neighboring mesas 30 along the long dimension of the mesas 30 in the elongation direction E. This elongated or strip series interconnect geometry is best seen in FIG. 2A. Moreover, during deposition of the electrically conductive connection material 52, first and second electrodes 60, 62 are also preferably formed at opposite ends of the linear arrangement of mesas 30. Each electrode 60, 62 is elongated in the elongation direction E, and preferably electrically contacts the adjacent light emitting diode mesa 30 along the length of the mesa in the elongation direction E. Specifically, the first electrode 60 electrically contacts the first conductivity type layer 14 in the first conductivity type connecting area 34 of its adjacent mesa 30, while the second electrode 62 electrically contacts the second conductivity type layer 16 in the active area 32 of its adjacent mesa 30.

Those skilled in the art will recognize certain advantages of the geometry of the light emitting. diode die 10. The linear arrangement of elongated mesas 30 series-interconnected by the elongated series interconnections 50 substantially eliminates electrical current non-uniformities and resultant hotspots. The electrical current flows across the die 10 in the general direction L of the linear arrangement. That is, the one-dimensional symmetry of the light emitting diode die 10 ensures that the local current density vector J is everywhere substantially parallel with the linear direction L. This uniformity is provided by the invariance of the die 10 in the transverse elongation direction E. Put yet another way, the elongated electrodes 60, 62 define a current flow direction corresponding to the direction L directed from one electrode to the other electrode (the polarity of the current flow direction being determined by the doping types of the first and second conductivity layers 14, 16). While the local current density vector J is everywhere substantially parallel with the linear direction L, those skilled in the art will recognize that some deviation of the local current density vector J from the linear direction L may result near the edges of the die 10 due to edge effects.

Moreover, the symmetry in the elongation direction E ensures that the local current density vector J is substantially uniform in magnitude throughout the active area of the die 10. Again, this generalization is limited in that some current density magnitude deviation may be present near the edges of the die 10 due to edge effects. This substantial uniformity in local current density magnitude reduces current bunching and consequent hotspots. Another advantage of the geometry of the light emitting diode die 10 is that the total length of the electrical current path is minimized, corresponding to the separation of the electrodes 60, 62 in the linear direction L. The minimized electrical current path length is a consequence of the uni-directional current flow in the linear direction L. The minimized current path length reduces resistive voltage drops and consequent resistive power losses and resistive heating.

Yet another advantage of the geometry of the light emitting diode die 10 is that the lateral area of the electrodes 60, 62 is reduced versus other designs. Because the electrodes 60, 62 are substantially coextensive with their adjacent mesas 30 and contact their adjacent mesas 30 substantially along the entire length of the mesas 30 in the elongation direction E, the injected current is distributed along the length of the mesas in the elongation direction E. This allows the width of the electrodes 60, 62 in the linear direction L to be reduced.

Still yet another advantage of the geometry of the light emitting diode die 10 is high reliability. Because the electrical current is distributed substantially uniformly along the elongation direction E, a failure of a portion of the mesa is generally not catastrophic. For example, a point defect that damages a small portion of one mesa 30 will cause current in that mesa to flow around the damaged area by deviating slightly in the elongation direction E.

Because of the reduced width of the electrodes 60, 62 in the linear direction L, the narrow elongated electrodes 60, 62 may be difficult to electrically contact using flip-chip bonding, wire bonding, or another mechanical process.

With reference to FIGS. 3A and 3B, an optional bonding bumps layer for facilitating flip-chip bonding is described. After formation of the series interconnects 50, an insulating layer 66 is applied to at least a portion of the linear arrangement of light emitting diode mesas 30. In the illustrated embodiment, the insulating layer 66 is substantially continuous, except for gaps at edges of the insulating layer 66 that leave portions of the electrodes 60, 62 exposed. The gaps exposing electrodes 60, 62 are preferably elongated in the elongation direction E to expose the elongated lengths of the mesas 30 and electrodes 60, 62. (Note that the insulating layer 66 is presumed to be relatively thin and optically transparent, and hence not visible in the top view of FIG. 3A. However, a partially or completely optically opaque insulating layer can also be used).

A first bonding bump 70 is disposed on a portion of the insulating layer 66 and on the exposed portion of the first electrode 60. The first bonding bump 70 connects with the first electrode 60 through a gap in the insulating layer 66. In the illustrated embodiment, the gap is defined by an edge of the insulating layer 66. The first bonding bump 70 extends substantially further in the linear direction L versus the corresponding first electrode 60. Similarly, a second bonding bump 72 is disposed on a portion of the insulating layer 66 and on the exposed portion of the second electrode 62. The second bonding bump 72 connects with the second electrode 62 through a gap in the insulating layer 66. In the illustrated embodiment, the gap is defined by an edge of the insulating layer 66. The second bonding bump 72 extends substantially further in the linear direction L versus the corresponding second electrode 62.

The larger area of the bonding bumps 70, 72 versus the corresponding electrodes 60, 62 facilitates flip-chip bonding. As best seen in FIG. 3A, the bonding bumps 70, 72 each have a larger area than the corresponding electrodes 60, 62. In the illustrated embodiment, the larger area is obtained through a larger extent of the bumps 70, 72 in the linear direction L as compared with the narrow electrodes 60, 62. In the illustrated embodiment, the electrodes 60, 62 are actually slightly longer in the elongation direction E versus the bonding bumps 70, 72. In other contemplated embodiments, the bumps and electrodes are coextensive in the elongation direction E, or the bumps may be longer in the elongation direction E versus the electrodes. While the bonding bumps 70, 72 are describes as facilitating flip-chip bonding, it will be appreciated that the bonding bumps 70, 72 also can facilitate wire bonding or another type of electrical connection.

Although shown as a single bonding bump, the bonding bumps 70, 72 can instead be multiple-layer stacks, such as a copper-coated nickel bump, a silver/gold bump, or the like. Multiple-layer stacks allow the bonding bumps 70, 72 to be optimized for adhesion, solder bonding, thermosonic bonding, or the like. The light emitting diode die 10 shown in FIGS. 3A and 3B is suitably flip-chip bonded to an associated support, such as a printed circuit board (not shown), by soldering or otherwise bonding the bonding bumps 70, 72 to electrical pads of the associated support. Because the bonding bumps 70, 72 have larger areas than the corresponding electrodes 60, 62, such flip-chip bonding can be performed with less precision than flip-chip bonding directly to the electrodes 60, 62. Moreover, while referred to as bonding bumps 70, 72, it will be appreciated that the bonding bumps may be generally planar metallic areas that bond to raised bonding bumps disposed on the printed circuit board.

Additionally, in the embodiment illustrated in FIGS. 3A and 3B, a thermal contact 74 overlays the three interior mesas 30 of the linear arrangement of light emitting diode mesas 30. The thermal contact 74 can be made of the same material or layer stack as the electrical bonding bumps 70, 72, or can be made of a different material or layer stack. The thermal contact 74 bonds to an electrically non-conductive region of the associated support, or to a conductive region of the associated support that is electrically isolated from electrical pathways on the associated support. In the embodiment of FIGS. 3A and 3B, the insulating layer 66 is preferably sufficiently thermally conductive so that heat from the interior mesas 30 readily passes through the insulating layer 66 to the thermal contact 74.

In addition to the illustrated components of the light emitting diode die 10, those skilled in the art will recognize that other components not illustrated can be readily incorporated into the die 10. Such additional components may include, for example, an epoxy encapsulant, a wavelength converting phosphor, additional light-reflective layers, a micro-lens, or the like.

In selecting the number of mesas and the dimensions of each mesa for a light emitting diode die such as the die 10, various factors should be taken into consideration. The total voltage is largely determined by the operating voltage of each individual mesa times the number of mesas. If, for example, the mesas 30 of the die 10 each have a forward operating voltage of 3.5 volts, then since there are five mesas the total voltage of the die 10 is about 5×3.5 volts which equals 17.5 volts. Other factors may affect the forward operating voltage of the die 10, such as resistance in the series interconnections 50. Generally, a higher voltage can be obtained by dividing the active area of the light emitting diode die into more and narrower elongated light emitting diode mesas, while lower voltage can be obtained by dividing the active area into fewer and wider elongated light emitting diode mesas. For example, assuming a 3.5 volt forward operating voltage for each mesa, thirty-four mesas provides a die forward operating voltage of about 119 volts.

Moreover, as the active die area is divided into greater numbers of elongated mesas, each mesa becomes more elongated. In some embodiments having only a few mesas, an elongation aspect ratio (that is, the ratio of the mesa dimension in the elongation direction E compared with the ratio of the mesa dimension in the linear direction L) is about 3:1. For embodiments having more mesas, elongation ratios of as high as 7:1 or higher are suitable.

There is no general constraint on the number of mesas or on the elongation ratio. However, material characteristics may impose some limits on the number or dimensions of mesas that can be employed for a given active die area. The width of each light emitting mesa in the linear direction L should be narrow enough for the electrical current to spread substantially uniformly across that width. If the mesa is too wide, the current may flow through the junction before reaching the distal end of the mesa, leading to substantial current non-uniformity and consequent loss of efficiency and generation of hotspots. Thus, for large active die areas, it may be advantageous to divide the mesa active area 32 of one, some, or all mesas 30 into a geometry that promotes current spreading.

With reference to FIGS. 4A and 4B, a light emitting diode die 110 with one such current spreading geometry in one mesa is described. The light emitting diode die 110 is similar to the light emitting diode die 10, and components of the die 110 having corresponding components in the die 10 are labeled with reference numbers offset from those of the die 10 by a factor of 100.

Thus, the light emitting diode die 110 includes a substrate 112, a first conductivity type layer 114 disposed between the substrate 112 and a second conductivity type layer 116, and an active region 118 disposed between the first and second conductivity type layers 114, 116. The first and second conductivity type layers 114, 116 and the active region 118 are collectively referred to herein as a device layers stack 120. The device layers stack 120 is patterned to define a plurality of elongated mesas 130, 130', specifically three mesas 130 in FIGS. 4A and 4B that are similar to one another and to the mesas 30 of the die 10, and a fourth, wider mesa 130' that includes the current-spreading geometry. Each mesa 130, 130' includes an active area containing the first and second conductivity type layers 114, 116 and the active region 118, and a first conductivity type connecting area containing the first conductivity layer 114 but not the second conductivity type layer 116 or the active region 118. Electrically isolating trenches 140 are disposed between the mesas.

The light emitting diode mesa 130' differs from the three other light emitting diode mesas 130 in that the light emitting diode mesa has its elongated active area divided into two elongated active areas 132a, 132b separated by a first conductivity type connecting area 134a connecting the first conductivity type layers of the two strips 132a, 132b. The light emitting diode mesa 130' also has a first conductivity type connecting area 134b for series interconnection with the adjacent light emitting diode mesa 130.

With reference to FIG. 5, series interconnects 150 are formed between the mesas 130, 130'. Each series interconnect 150 is interposed between two neighboring elongated light emitting diode mesas 130, 130'. Thus, for the illustrated four mesas 130, 130' there are three series interconnects 150. There is also a parallel interconnect 150' that connects the two elongated active areas 132a, 132b separated by the first conductivity type connecting area 134a of the mesa 130'.

Each series interconnect 150 includes an electrically conductive connection material 152 that electrically connects the first conductivity type connecting area of one mesa with the second conductivity type layer of a neighboring mesa, and insulating material 154 disposed at least over a step between the active area and the first conductivity type connecting area 34, and also disposed at the edge of the mesa distal from the first conductivity type connecting area, to provide electrical isolation.

Similarly, the parallel interconnect 150' includes an electrically conductive connection material 152' that electrically connects the second conductivity type layers of the two active areas 132a, 132b, and insulating material 154' deposited over the first conductivity type connecting area 134a to provide electrical isolation. The parallel interconnect is preferably elongated in the elongation direction E. The parallel interconnect is achieved by connection of the first conductivity type layers through the first conductivity type connecting area 134a and connection of the second conductivity type layers through the electrically conductive connection material 152'.

It will be appreciated that the light emitting diode mesa 130' has improved current spreading across the mesa 130' due to the division of the mesa 130' into two parallel interconnected sub-mesas 132a, 132b. For the example 3.5 volts per diode junction, the light emitting diode die 110 has a forward die operating voltage of 4×3.5 volts which equals 14 volts, compared with 17.5 volts for the five-mesa die 10.

Figure 6:
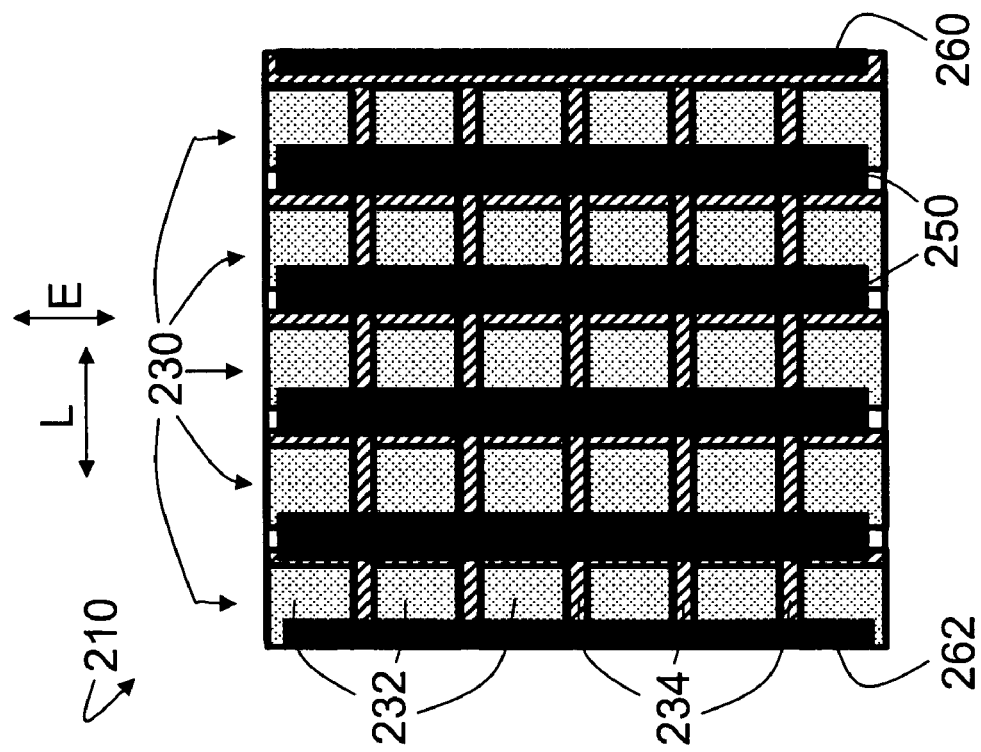
FIG. 6 shows a top view of another light emitting diode die including five light emitting diode suitable for series interconnection, in which each mesa is divided in the elongation direction into square sub-mesas suitable for parallel interconnection.

With reference to FIG. 6, another current spreading geometry is described. In FIG. 6, a light emitting diode die 210 has five elongated light emitting diode mesas 230 elongated in the elongation direction E which is transverse to the linear direction L. Each mesa 230 is divided into five sub-mesas or active regions 232 that are electrically connected in parallel by intervening first conductivity type connecting areas 234 and by the electrically conductive material of series interconnections 250. The die 210 also includes elongated electrodes 260, 262 that are elongated in the elongation direction E and that connect with the adjacent mesas 230 at discrete locations, specifically in FIG. 6 at the five active regions 232.

Figure 7:
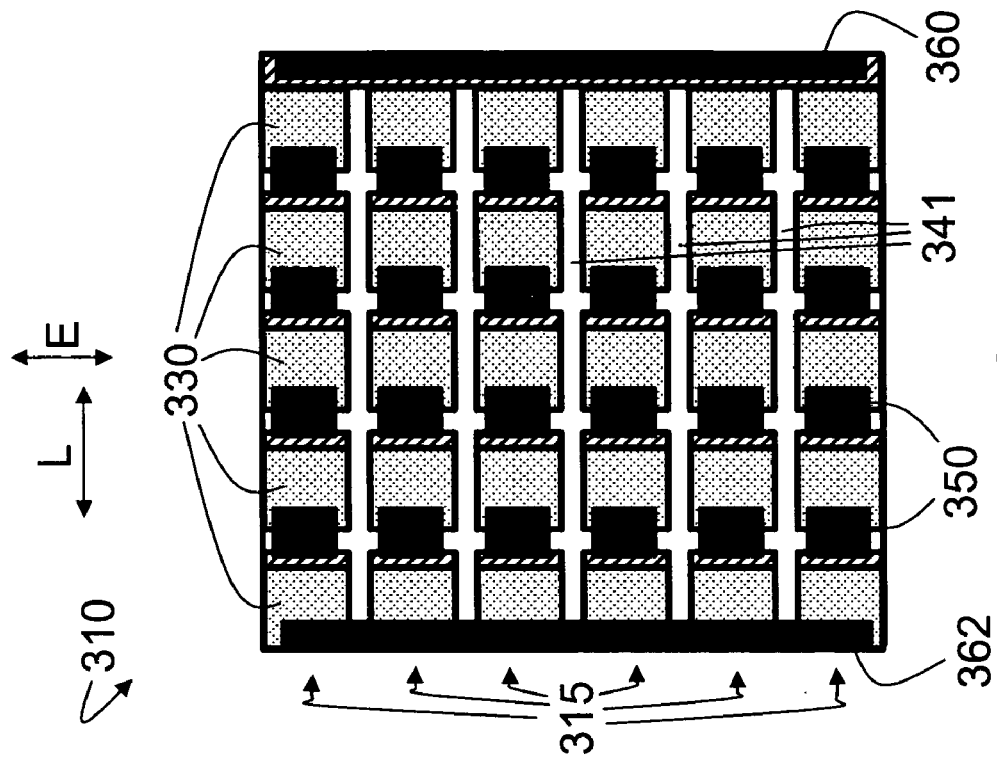
FIG. 7 shows a top view of yet another light emitting diode die including five light emitting diode mesas suitable for series interconnection, in which each mesa is divided in the elongation direction into square sub-mesas suitable for parallel interconnection.

With reference to FIG. 7, a light emitting diode die 310 has six parallel sets 315 of series-interconnected light emitting diode mesas 330. Each set 315 of series-interconnected light emitting diode mesas 330 extends along the linear direction L and includes five mesas 330 and four series interconnections 350. The six sets 315 are distributed along the elongation direction E. The six sets 315 are connected by elongated electrodes 360, 362 which are elongated in the elongation direction E and are disposed at opposite ends of the sets 315 in the linear direction L. In the embodiment of FIG. 7, the electrodes 360, 362 provide the only interconnection between the six sets 315 of series interconnected mesas 330. The series interconnections 350 do not extend between the sets 315, and trenches 341 running parallel to the linear direction L between the sets 315 isolate the light emitting diode mesas 330 between the sets 315.

In the embodiment of FIG. 7, the individual mesas 330 are substantially not elongated. Rather, the use of a plurality of sets 315 of series-interconnected light emitting diode mesas 330 extending along the length of the elongated electrodes 360, 362 and interconnected by the elongated electrodes 360, 362 provides current spreading in the elongation direction E. The local current density in each set 315 of series-interconnected light emitting diode mesas 330 is parallel to the linear direction L substantially throughout the die 310. Thus, the die 310 has advantages such as short total current path, uniform magnitude and direction of current density throughout the die, and consequent reduction in hotspots and improved reliability.

It will be appreciated that any of the light emitting diode die 110, 210, 310 can include the additional bonding bumps structure including the insulating layer 66 and bonding bumps 70, 72 shown in FIGS. 3A and 3B in conjunction with the die 10. The structure 66, 70, 72 promotes flip-chip bonding, and can enable direct flip-chip bonding of the light emitting diode die to a printed circuit board without using an intervening sub-mount. The structure 66, 70, 72 can also be advantageous in non-inverted diode die that are electrically contacted by wire bonding. Any of the light emitting diode die 110, 210, 310 can further include the thermal contact 74 shown in FIGS. 3A and 3B in conjunction with the die 10, for promoting heat sinking in the case of flip-chip bonding.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A light emitting device comprising:
   an electrically insulating substrate;
   a plurality of elongated light emitting diode mesas disposed generally parallel to one another on the substrate, the mesas being electrically isolated from one another, each light emitting diode mesa defined by a stack of layers including a first conductivity type layer disposed between the substrate and a second conductivity type layer and further including at least one of:
      an active region disposed between the first conductivity type layer and the second conductivity type layer, and
      a buffer layer disposed between the substrate and the first conductivity type layer; and
   electrically conductive connection material disposed on the substrate between neighboring elongated light emitting diode mesas, the conductive material electrically connecting the first conductivity type layer of one mesa with the second conductivity type layer of the neighboring mesa along the long dimension of the neighboring elongated mesas to series-interconnect the light emitting diode mesas.

2. The light emitting device as set forth in claim 1, further comprising:
   a first elongated electrode arranged generally parallel with the elongated light emitting diode mesas and electrically connected to the first conductivity type layer of an elongated light emitting diode mesa disposed at one end of the plurality of elongated light emitting diode mesas; and
   a second elongated electrode arranged generally parallel with the elongated light emitting diode mesas and electrically connected to the second conductivity type layer of a light emitting diode mesa disposed at an opposite end of the plurality of elongated light emitting diode mesas.

3. The light emitting device as set forth in claim 2, wherein:
   the first elongated electrode is electrically connected with the corresponding first conductivity type layer at a plurality of discrete locations distributed along the long dimension of the light emitting diode mesa; and
   the second elongated electrode is electrically connected with the corresponding second conductivity type layer at a plurality of discrete locations distributed along the long dimension of the light emitting diode mesa.

4. The light emitting device as set forth in claim 1, wherein:
   the electrically conductive connection material forms a substantially continuous electrical connection of the neighboring mesas along the length of the long dimension of the neighboring mesas.

5. The light emitting device as set forth in claim 1, wherein:
   the electrically conductive connection material is distributed in separate discrete portions along the length of the long dimension of the neighboring mesas.

6. The light emitting device as set forth in claim 1, wherein the second conductivity type layer of at least one mesa of the linear array of generally parallel elongated light emitting diode mesas includes a plurality of second conductivity type layer islands, the light emitting device further including:
   electrically conductive parallel connection material electrically connecting the plurality of second conductivity type layer islands, the electrically conductive parallel connection material being electrically isolated from the first conductivity type layer.

7. The light emitting device as set forth in claim 1, wherein the second conductivity type layer of at least one of the plurality of elongated light emitting diode mesas has a patterned lateral distribution that promotes current spreading in the layer.

8. A light emitting device comprising:
   an electrically insulating substrate;
   a plurality of elongated light emitting diode mesas disposed generally parallel to one another on the substrate, the mesas being electrically isolated from one another, each mesa defined by a stack of layers including a first conductivity type layer disposed between the substrate and a second conductivity type layer; and
   electrically conductive connection material disposed on the substrate between neighboring elongated light emitting diode mesas, the conductive material electrically connecting the first conductivity type layer of one mesa with the second conductivity type layer of the neighboring mesa along the long dimension of the neighboring elongated mesas to series-interconnect the light emitting diode mesas;
   wherein the electrically insulating substrate includes electrically conductive substrate material and an electrically insulating layer electrically isolating the plurality of elongated light emitting diode mesas and the electrically conductive connection material from the electrically conductive substrate material.

9. A light emitting device comprising:
   an electrically insulating substrate;
   a plurality of elongated light emitting diode mesas disposed generally parallel to one another on the substrate, the mesas being electrically isolated from one another, each mesa defined by a stack of layers including a first conductivity type layer disposed between the substrate and a second conductivity type layer; and
   electrically conductive connection material disposed on the substrate between neighboring elongated light emitting diode mesas, the conductive material electrically connecting the first conductivity type layer of one mesa with the second conductivity type layer of the neighboring mesa along the long dimension of the neighboring elongated mesas to series-interconnect the light emitting diode mesas, the electrically conductive connecting material conducting electrical current flow between each pair of neighboring elongated light emitting diode mesas in an electrical current flow direction that is substantially transverse to the long dimension of the elongated light emitting diode mesas.

10. The light emitting device as set forth in claim 9, further comprising:
a first elongated electrode arranged generally parallel with the elongated light emitting diode mesas and electrically connected to the first conductivity type layer of an elongated light emitting diode mesa disposed at one end of the plurality of elongated light emitting diode mesas; and
a second elongated electrode arranged generally parallel with the elongated light emitting diode mesas and electrically connected to the second conductivity type layer of a light emitting diode mesa disposed at an opposite end of the plurality of elongated light emitting diode mesas.

11. The light emitting device as set forth in claim 10, wherein:
the first elongated electrode is electrically connected with the corresponding first conductivity type layer at a plurality of discrete locations distributed along the long dimension of the light emitting diode mesa; and
the second elongated electrode is electrically connected with the corresponding second conductivity type layer at a plurality of discrete locations distributed along the long dimension of the light emitting diode mesa.

12. The light emitting device as set forth in claim 9, wherein:
the electrically conductive connection material forms a substantially continuous electrical connection of the neighboring mesas along the length of the long dimension of the neighboring mesas.

13. The light emitting device as set forth in claim 9, wherein:
the electrically conductive connection material is distributed in separate discrete portions along the length of the long dimension of the neighboring mesas.

14. The light emitting device as set forth in claim 9, wherein the second conductivity type layer of at least one mesa of the linear array of generally parallel elongated light emitting diode mesas includes a plurality of second conductivity type layer islands, the light emitting device further including:
electrically conductive parallel connection material electrically connecting the plurality of second conductivity type layer islands, the electrically conductive parallel connection material being electrically isolated from the first conductivity type layer.

15. The light emitting device as set forth in claim 9, wherein the second conductivity type layer of at least one of the plurality of elongated light emitting diode mesas has a patterned lateral distribution that promotes current spreading in the layer.

16. A light emitting semiconductor device die comprising:
an electrically insulating substrate;
a linear arrangement of light emitting diode mesas disposed on the substrate, each light emitting diode mesa being elongated in a direction of elongation transverse to the linear direction of the linear arrangement, an elongation aspect ratio of the light emitting diode mesas being greater than 7:1;
electrical series interconnections disposed on the substrate between neighboring light emitting diode mesas of the linear arrangement, the series interconnections interconnecting the light emitting diode mesas in series to form a series-interconnected linear arrangement of light emitting diode mesas; and
first and second electrodes electrically connecting at opposite ends with the series-interconnected linear arrangement of light emitting diode mesas, the linear arrangement of light emitting diode mesas extending in the linear direction between the first and second electrodes.

17. A light emitting semiconductor device die comprising:
an electrically insulating substrate;
a linear arrangement of light emitting diode mesas disposed on the substrate, each light emitting diode mesa being elongated in a direction of elongation transverse to the linear direction of the linear arrangement, an elongation aspect ratio of the elongation being greater than 3:1;
electrical series interconnections disposed on the substrate between neighboring light emitting diode mesas of the linear arrangement, the series interconnections interconnecting the light emitting diode mesas in series to form a series-interconnected linear arrangement of light emitting diode mesas; and
first and second electrodes electrically connecting at opposite ends with the series-interconnected linear arrangement of light emitting diode mesas, the linear arrangement of light emitting diode mesas extending in the linear direction between the first and second electrodes.

18. The light emitting semiconductor device die as set forth in claim 17, wherein each electrical series interconnection includes:
a plurality of discrete connections distributed along the direction of elongation and electrically connecting the neighboring light emitting diode mesas.

19. The light emitting semiconductor device die as set forth in claim 17, wherein each electrical series interconnection includes:
an elongated electrically conductive strip oriented parallel to the direction of elongation of the neighboring elongated light emitting diode mesas, the elongated electrically conductive strip being substantially co-extensive with the elongated side of the neighboring mesas.

20. The light emitting semiconductor device die as set forth in claim 17, wherein each electrode comprises:
a plurality of electrodes distributed along the long side of the adjacent elongated light emitting diode mesa and electrically connecting with said adjacent elongated light emitting diode mesa.

21. The light emitting semiconductor device die as set forth in claim 17, wherein at least one light emitting diode mesa of the linear arrangement of light emitting diode mesas comprises:
a plurality of light emitting diode sub-mesas electrically connected in parallel.

22. The light emitting semiconductor device die as set forth in claim 17, further comprising:
one or more thermal conductors disposed on the linear arrangement of light emitting diode mesas between the first and second electrodes, the thermal conductors adapted to conduct heat from the linear arrangement of light emitting diode mesas to an associated mounting surface when the light emitting semiconductor device die is flip-chip die-attached to said associated mounting surface.

23. The light emitting semiconductor device die as set forth in claim 17, further comprising:
a plurality of series-interconnected linear arrangements of light emitting diode mesas distributed along a direction transverse to the linear direction of the linear arrangements, the first and second electrodes electrically connecting at opposite ends with each of the series-interconnected linear arrangements of light emitting diode mesas, the linear arrangements of light emitting diode mesas lying between the first and second electrodes.

\* \* \* \* \*